United States Patent [19]

Leenders et al.

[11] Patent Number: 5,541,034
[45] Date of Patent: Jul. 30, 1996

[54] PRODUCTION OF LITHOGRAPHIC PRINTING PLATES IN A DRY MANNER

[75] Inventors: Luc Leenders, Herentals; Rudy Van Cleuvenbergen, Zandhoven; Rudi De Busser, Bouwel; Marcel Monbaliu, Mortsel, all of Belgium

[73] Assignee: Agfa-Gevaert, N.V., Mortsel, Belgium

[21] Appl. No.: 244,629

[22] PCT Filed: Nov. 20, 1992

[86] PCT No.: PCT/EP92/02673
§ 371 Date: Jun. 3, 1994
§ 102(e) Date: Jun. 3, 1994

[87] PCT Pub. No.: WO93/11466
PCT Pub. Date: Jun. 10, 1993

[30] Foreign Application Priority Data

Dec. 6, 1991 [EP] European Pat. Off. .............. 91203194

[51] Int. Cl.$^6$ ............................................. G03C 8/00
[52] U.S. Cl. .................... 430/203; 430/204; 430/254; 430/300; 430/309; 430/611; 430/619
[58] Field of Search ............................ 430/619, 254, 430/204, 300, 309, 611, 203

[56] References Cited

U.S. PATENT DOCUMENTS 4,845,018  7/1989  Sato et al. ........................... 430/619

*Primary Examiner*—Thorl Chea
*Attorney, Agent, or Firm*—Breiner & Breiner

[57] ABSTRACT

Heat-developable silver-based photosensitive imaging element comprising a heat-reducible organic silver salt, a photosensitive silver halide, a developing agent, and a releasing compound that upon reaction with either the reduced or the oxidized form of the developing agent is capable of releasing a hydrophobizing agent. The invention also relates to a method for producing a lithographic printing plate comprising image-wise exposing an imaging element, bringing the exposed element in face-to-face contact with an oleophobic surface of a printing plate precursor, heating the imaging element while in contact or before being brought in contact with the oleophobic surface to cause reduction of the organic silver salt and to cause the release of the hydrophobizing agent from the releasing compound, allowing the hydrophobizing agent to diffuse to the oleophobic surface to render the surface image-wise oleophilic, and separating the resulting lithographic printing plate from the imaging element.

4 Claims, No Drawings

PRODUCTION OF LITHOGRAPHIC PRINTING PLATES IN A DRY MANNER

FIELD OF THE INVENTION

The present invention relates to a heat-developable silver-based photosensitive imaging element coated from aqueous compositions and to a method for producing a lithographic printing plate in a dry manner by means of said imaging element.

BACKGROUND OF THE INVENTION

Lithography is the process of printing from specially prepared surfaces, some areas of which are capable of accepting lithographic ink, whereas other areas, when moistened with water, will not accept the ink. The areas accepting ink are the printing image areas and the ink-rejecting areas are the background areas.

In the art of photolithography, a photographic material is made image-wise receptive to oily or greasy inks in the photo-exposed (negative-working) or in the non-exposed (positive-working) areas on a hydrophilic background. Common photographic materials employed for making a lithographic printing plate are materials based on a photosensitive polymer or are silver salt diffusion transfer materials.

Silver salt diffusion transfer materials offer the advantage of having a high speed in a broad spectral range, whereas common photosensitive polymer materials are only sensitive to light of a narrow spectral range, commonly between 300 and 500 nm. Furthermore, photosensitive polymers do not offer the speed of a silver halide material.

Silver salt diffusion transfer materials require the use of liquid processing baths. As a consequence, the formation of a lithographic printing plate by means of such materials takes much time and requires much labour. The chemicals used in the wet processing are harmful to the human body and they soil the cloths and hands of the operators.

In GB-P 1,454,271 a method of making a lithographic printing plate in a dry manner has been described, which method comprises image-wise exposing to actinic radiation the sensitive layer of a photosensitive heat-processable photographic material, which layer contains a binder and, as part of an image-forming system, a light-insensitive reducible metal salt of a straight-chain fatty acid having at least 10 carbon atoms, heating the layer to develop a first image therein by reduction of the metal salt and thereby liberate fatty acid, and holding the layer in contact with a receiving sheet e.g. a hydrophilic grained anodized aluminium foil, whilst being held at a temperature above the melting point of the fatty acid so that fatty acid-containing material transfers from the developed areas to the receiving sheet to produce an oleophilic transfer image. However, an important disadvantage is that organic solvents are needed for preparing and coating the photosensitive heat-processable photographic material used according to that method. The use of organic solvents is more expensive than that of aqueous solvents, and moreover, organic solvents may be harmful ecologically.

It is therefore desired that the photosensitive silver-based material be coated from aqueous compositions and that the material be treated in a dry manner without the use of liquid processing solutions.

SUMMARY OF THE INVENTION

It is an object of the present invention to provide a heat-developable silver-based photosensitive imaging element coated from aqueous compositions.

It is another object of the present invention to provide a method for producing a lithographic printing plate in a dry manner by means of said heat-developable silver-based photosensitive imaging element.

Further objects of the present invention will become clear from the description hereinafter.

According to the present invention a heat-developable silver-based photosensitive imaging element is provided, which comprises a heat-reducible organic silver salt, a photosensitive silver halide a developing agent, and a releasing compound wherein said releasing compound is capable of information-wise releasing a hydrophobizing agent under the development conditions used for heat-developing exposed silver salts.

The present invention also provides a heat-developable silver-based photosensitive imaging element comprising a support carrying a photosensitive layer comprising a heat-reducible organic silver salts, a photosensitive silver halide capable of forming a latent image that can act as a catalyst to induced development i.e. reduction of said organic silver salt under the influence of heat, and a releasing compound, and a covering layer, wherein said photosensitive layer and said covering layer have been coated from aqueous compositions comprising a binder and wherein said photosensitive layer and/or said covering layer comprise a developing agent and a said releasing compound that is capable of releasing a hydrophobizing agent upon reaction with either the reduced or the oxidized form of said developing agent, preferably an aromatic primary amino developing agent.

According to the present invention a method for producing a lithographic printing plate in a dry manner is also provided, which method comprises the steps of:

image-wise exposing a heat-developable silver-based photosensitive imaging element comprising a heat-reducible organic silver salt, a photosensitive silver halide capable of forming a latent image that can act as a catalyst to induce development i.e. reduction of said organic silver salt under the influence of heat, a releasing compound that upon reaction with either the reduced or the oxidized form of a developing agent is capable of releasing a hydrophobizing agent, and a said developing agent, preferably an aromatic primary amino developing agent, bringing said image-wise exposed imaging element in face-to-face contact with an oleophobic surface of a printing plate precursor, heating said imaging element while in contact or before being brought in contact with said oleophobic surface to cause development i.e. reduction of said organic silver salt at the places where such reduction has been induced by the latent image and to cause thereby the image-wise release of said hydrophobizing agent from said releasing compound, allowing said hydrophobizing agent—optionally while supplying additional heat—to diffuse to said oleophobic surface to render said surface image-wise oleophilic, and separating the resulting lithographic printing plate from said imaging element.

DETAILED DESCRIPTION OF THE INVENTION

Through the catalytic influence of the latent image in said image-wise exposed photosensitive silver halide on the organic silver salt present in the imaging element of the present invention said organic silver salt is rendered thermally developable by a developing agent, preferably an aromatic primary amino developing agent.

At the areas of the imaging element where the reducing or developing agent is oxidized during the thermal development, the releasing compound can enter into reaction with said oxidized developing agent and thereby release a hydrophobizing agent. Alternatively, at the areas of the imaging element where the developing agent is in reduced form, the releasing compound can enter into reaction with said reduced developing agent and thereby release a hydrophobizing agent.

The released hydrophobizing agent diffuses image-wise to the oleophobic surface of the printing plate precursor and enters into reaction with said oleophobic surface to form an oleophilic image thereon. After separation from the imaging element a lithographic printing plate is obtained.

Compounds, which are capable of releasing a hydrophobizing agent upon reaction with either the reduced or the oxidized form of an aromatic primary amino developing agent and which can be used advantageously in accordance with the present invention, are compounds comprising a hydrophobizing agent moiety linked to a carrier moiety. Several mechanisms describing the release of a compound from a carrier moiety are known in the prior art. Releasing mechanisms that can be used in accordance with the present invention have been disclosed in the article of C. Van de Sande in Angew. Chem. Int. Ed. Engl. 22 (1983) pages 191–209, which is hereby included by reference. Preferred mechanisms for releasing the hydrophobizing agent from the carrier moiety are the so-called redox-controlled systems in which the hydrophobizing agent can be released from the carrier moiety when the carrier moiety is either in its reduced or its oxidized form.

According to the most preferred mode of the present invention the hydrophobizing agent is released from the carrier moiety upon a coupling reaction with the oxidized form of a developing agent. Such carrier moieties are known as couplers and the corresponding compounds are known as coupler compounds.

Coupler compounds are commonly used in colour photographic recording materials to produce a dye since by coupling of oxidized developing agent with the coupler compound a dye can be formed. See e.g. EP-A 0,347,849, U.S. Pat. Nos. 3,148,062, 3,227,554, 3,617,291, and 3,660,095. Another type of coupler compounds are those, which upon reaction with an oxidized developing agent, produce a colourless compound. Examples of such compounds have been disclosed in e.g. GB-P 861,138 and U.S. Pat. Nos. 3,632,345, 3,928,041, 3,958,993, and 3,961,959.

Hydrophobizing agents are frequently used in the art of lithography for increasing the hydrophobicity of e.g. a silver image produced according to the silver salt diffusion transfer method. Hydrophobizing agents often contain a mercapto group capable of reacting with a metal layer. U.S. Pat. No. 3,776,728 describes the use of heterocyclic mercapto-compounds, e.g. a 2-mercapto-1,3,4-oxadiazole derivative, as hydrophobizing agents. U.S. Pat. No. 4,563,410 discloses hydrophobizing liquids containing one or more mercaptotriazole or mercaptotetrazole derivatives.

Releasing compounds, preferably coupler compounds, comprising a releasable hydrophobizing agent as photographically useful group (PUG) are used in the imaging element of the present invention.

Preferred releasing compounds that are capable of releasing a hydrophobizing agent upon coupling reaction with the oxidized form of a developing agent agent for use in accordance with the present invention correspond to general formula I:

$$\text{COUP-MERCAPTO} \qquad (I)$$

wherein:

COUP stands for a coupler moiety, and

MERCAPTO stands for a moiety that after release from COUP contains a mercapto group and that is attached to the coupling position of the coupler moiety.

Examples of coupler moieties suitable for use in accordance with the present invention are the coupler moieties described in EP-A 0,347,849 and in the references cited therein, which are all included herein by reference. Preferred couplers for use in accordance with the present invention are couplers that form magenta dyes upon coupling with oxidized p-phenylene diamine compounds in classical silver halide photography e.g. pyrazolones or pyrazolotriazoles, couplers that form yellow dyes upon coupling e.g. acylacetamides such as benzoylacetanilides or pivaloylacetanilides, couplers that form cyan dyes upon coupling e.g. phenols or naphthols, couplers forming a colourless product upon coupling e.g. cyclic carbonyl-containing compounds.

MERCAPTO moieties suitable for use in accordance with the present invention are heterocyclic moieties corresponding to general formula II:

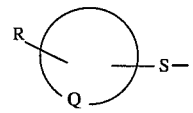

(II)

wherein:

R represents hydrogen, an alkyl group, an alkylaryl group, an alkoxy group, an aryl group or a substituted aryl group, and Q represents a group of atoms necessary to complete a heterocyclic ring including fused heterocyclic ring systems e.g. oxazole, oxadiazole, triazole, tetrazole, thiazole, thiadiazole, imidazole, benzimidazole, benzoxazole, and benzothiazole.

A preferred MERCAPTO moiety corresponds to the structural formula III:

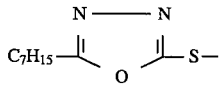

(III)

Preferred coupler compounds for use in accordance with the present invention correspond to the following structural formulae CC1 to CC4:

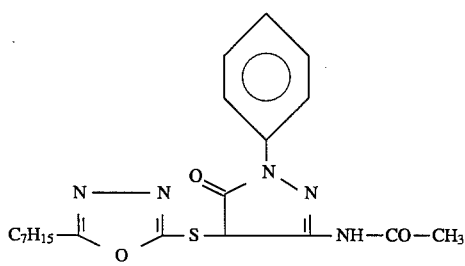
(CC1)

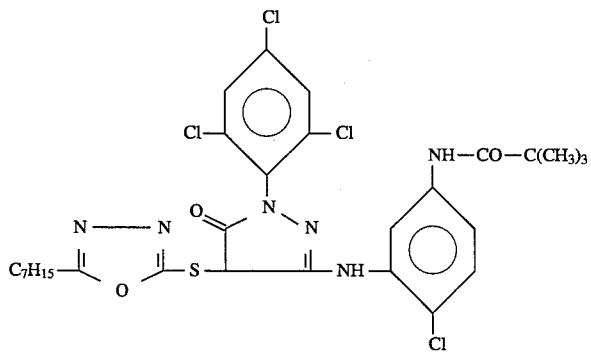
(CC2)

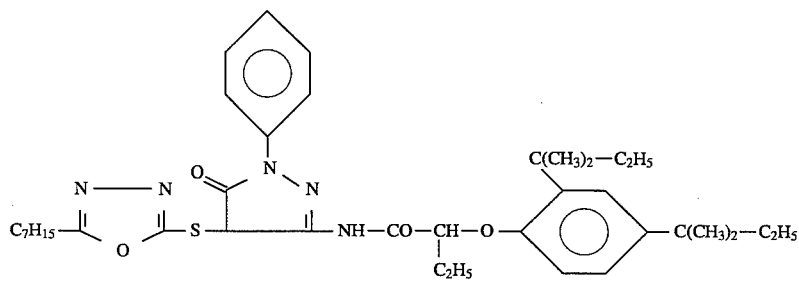
(CC3)

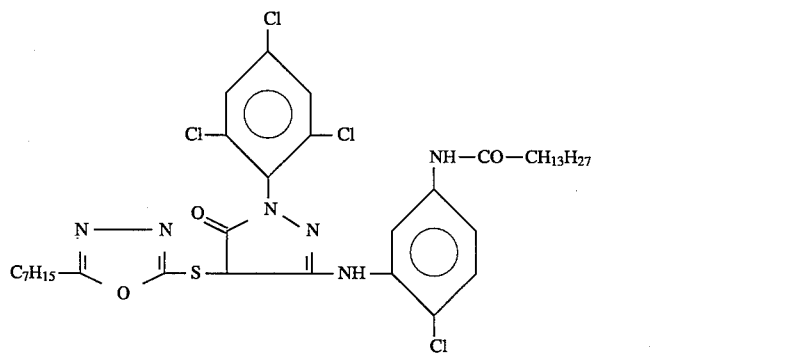
(CC4)

The photosensitive silver halide can be any photosensitive silver halide emulsion comprising a hydrophilic colloid binder. The photosensitive silver halide used in the present invention may comprise e.g. silver bromide, silver iodide, silver chlorobromide, silver bromoiodide, silver chlorobromoiodide and the like, or mixtures thereof.

The silver halide emulsions may be coarse-or fine-grained and can be prepared by any of the well known procedures e.g. single jet emulsions, double jet emulsions such as Lippmann emulsions, ammoniacal emulsions, thiocyanate- or thioether-ripened emulsions such as those described in U.S. patent application Ser. Nos. 2,222,264, 3,320,069, and 3,271,157. Surface image emulsions may be used or internal image emulsions may be used such as those described in U.S. patent application Ser. Nos. 2,592,250, 3,206,313, and 3,447,927. If desired, fixtures of surface and internal image emulsions may be used as described in U.S. patent application Ser. No. 2,996,382. The silver halide particles of the photographic emulsions may have a regular crystalline form such as a cubic or octahedral form or they may have a transition form. Regular-grain emulsions are described in e.g. J. Photogr. Sci., Vol. 12, No. 5, Sept./Oct. 1964, pp. 242–251. The silver halide grains may also have an almost spherical form or they may have a tabular form (so-called T-grains), or may have composite crystal forms comprising a mixture of regular and irregular crystalline forms. The silver halide grains may have a multilayered structure having a core and shell of different halide composition. Besides having a differently composed core and shell the silver halide grains may comprise also different halide compositions and metal dopants inbetween.

Two or more types of silver halide emulsions that have been prepared differently can be mixed for forming a photosensitive silver halide for use in the imaging element of the present invention.

The average size of the silver halide grains may range from 0.2 to 1.2 um, and the size distribution can be homodisperse or heterodisperse. A homodisperse size distribution is obtained when 95% of the grains have a size that does not deviate more than 30% from the average grain size.

The silver halide crystals can be doped with $Rh^{3+}$, $Ir^{4+}$, $Cd^{2+}$, $Zn^{2+}$, $Pb^{2+}$.

The photographic emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The emulsion can be desalted in the usual ways e.g. by dialysis, by flocculation and re-dispersing, or by ultrafiltration.

Apart from negative-working silver halide emulsions that are preferred for their high photosensitivity, use can be made also of direct-positive silver halide emulsions that produce a positive silver image.

For instance, direct-positive emulsions of the type described in U.S. patent application Ser. No. 3,062,651 may be employed.

The emulsions can be chemically sensitized e.g. by adding sulphur-containing compounds during the chemical ripening stage e.g. allyl isothiocyanate, allyl thiourea, and sodium thiosulphate. Also developing agents e.g. the tin compounds described in BE-A 493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65–72 (1951).

The emulsions can also be sensitized with polyalkylene oxide derivatives, e.g. with polyethylene oxide having a molecular weight of 1000 to 20,000, or with condensation products of alkylene oxides and aliphatic alcohols, glycols, cyclic dehydration products of hexitols, alkyl-substituted phenols, aliphatic carboxylic acids, aliphatic amines, aliphatic diamines and amides. The condensation products have a molecular weight of at least 700, preferably of more than 1250. It is also possible to combine these sensitizers with each other as described in BE-A 537,278 and GB-A 727,982.

The spectral photosensitivity of the silver halide can be adjusted by proper sensitization to any desired spectral range comprised between 300 and 900 nm by means of the usual mono- or polymethine dyes such as acidic or basic cyanines, hemicyanines, oxonols, hemioxonols, styryl dyes or others, also tri- or polynuclear methine dyes e.g. rhodacyanines or neocyanines. Such spectral sensitizers have been described by e.g. F. M. Hamer in "The Cyanine Dyes and Related Compounds" (1964) Interscience Publishers, John Wiley & Sons, New York. The spectral photosensitivity of the silver halide can also be adjusted for exposure by laser light e.g. helium-neon laser light, argon laser light, and solid state laser light. Dyes that can be used for adjusting the photosensitivity to laser light have been described in i.a. JA-A 62284344, 62284345, 62141561, 62103649, 62139555, 62105147, 62105148, 62075638, 62062353, 62062354, 62062355, 62157027, 62157028, 62113148, 61203446, 62003250, 60061752, 55070834, 51115821, 51115822, 51106422, 51106423, 51106425; DE-A 3,826,700; U.S. patent application Ser. Nos. 4,501,811, 4,725,532, 4,784, 933; GB-A 1,467,638; and EP-A 100,654 and in documents cited therein. The silver halide can also be sensitized with dyes providing a spectral sensitivity mainly in the range of 400 to 540 nm and not extending the sensitivity substantially beyond 540 nm so that the resulting photosensitive material can be handled in yellow safe-light conditions prior to the image-wise exposure. Suitable dyes that can be used for that purpose have been described in e.g. U.S. patent application Ser. No. 4,686,170.

The organic silver salt used in accordance with the present invention can be at least one of the known organic silver salts e.g. those cited in EP-A 0,236,508 and U.S. Pat. No. 4,948,698 and in the documents referred to in these. One organic silver salt or a combination of different organic silver salts can be used. Preferred organic silver salts are the silver benzotriazole salts e.g. 1-silver-4-methyl-benzotriazolate and 1-silver-5-methyl-benzotriazolate.

The organic silver salts are used in an amount of 0.01 to 500 mol, preferably 0.1 to 100 mol, per mol of photosensitive silver halide.

Besides the silver halide and the organic silver salt another essential component of the photosensitive layer is the binder. The binder is a hydrophilic colloid, usually a protein, preferably gelatin. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole,, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates. Preferably gelatin or a gelatin derivative is used in combination with synthetic hydrophilic polymers e.g. poly-N-vinyl pyrrolidone and polyvinyl alcohol.

Usually, the binder or binder mixture is employed in an amount of 0.05 to 50 g, preferably of 0.2 to 20 g, per m2 of the support.

The ratio of binder or binder mixture to the coupler compound capable of releasing a hydrophobizing agent ranges from 0.1 to 10 g, preferably from 0.2 to 5 g, of binder to 1 g of said coupler compound.

The developing agent can be any developing agent or a combination of developing agents commonly employed in thermally developable imaging elements. Suitable thermal developing agents have been described in EP-A 0,173,584, EP-A 0,236,508, and EP-A 0,286,850. Suitable representatives of thermal developing agents are aromatic primary amino developing agents e.g. p-phenylene-diamine and p-aminophenol developing agents. Preferred thermal developing agents are the alkali metal salts of p-phenylene diamine derivatives carrying a sulpho group on one of the amino groups. A particularly preferred developing agent corresponds to the following structural formula D1:

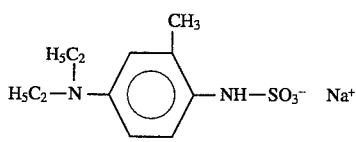

D1

The thermal developing agent(s) can be incorporated into the photosensitive layer and/or into the covering layer and/or into an additional layer between the photosensitive layer and the covering layer. Preferably, however, they are incorporated into the covering layer.

Usually, the amount of developing agent varies between 0.01 and 1500 mol, preferably 0.1 to 200 mol per mol of photosensitive silver halide.

The heat-induced development of the silver salt under the catalytic influence of image-wise exposed silver halide and the transfer of the released hydrophobizing agent can be facilitated by the presence of thermal solvents in the photosensitive layer and/or into the covering layer. Any substances capable of facilitating or accelerating thermal development and thermal transfer can be used as thermal solvent in the imaging element of the present invention. Preferably, these substances are solid, semi-solid, or liquid and capable of dissolving or fusing in a binder when heated up. Suitable thermal solvents are urea derivatives e.g. dimethylurea, diethylurea, and phenylurea; amides e.g. acetamide, benzamide, and p-toluamide; polyhydric alcohols e.g. 1,5-pentanediol, 1,6-pentanediol, 1,6-hexanediol, 1,2-cyclohexanediol, pentaerythritol, polyethylene glycol, and 2-ethyl-2-(hydroxymethyl)-1,3-propanediol; sulfonamide derivatives e.g. benzenesulfonamide and α-toluenesulfonamide. Other suitable thermal solvents can be found in the Research Disclosure publications, October 1976, item 15027, November 1976, item 15108, and June 1978, item 17029; in DE-A 3,529,930 and 3,529,934, and in EP-A 0,119,615 and 0,112, 512. Among the suitable thermal solvents 2-ethyl-2-(hydroxymethyl)-1,3-propanediol is a preferred one.

The thermal solvents are commonly used in amounts of 10 to 600% by weight, preferably 30 to 300% by weight, of the binder.

The photosensitive layer may comprise at least one antifogging agent. Many known compounds can be added as antifogging agent. Suitable examples are i.a. the heterocyclic nitrogen-containing compounds e.g. benzothiazolium salts, nitroimidazoles, nitrobenzimidazoles, chlorobenzimidazoles, bromobenzimidazoles, mercaptothiazoles, mercaptobenzothiazoles, mercaptobenzimidazoles, mercaptothiadiazoles, aminotriazoles, benzotriazoles (preferably 5-methyl-benzotriazole), nitrobenzotriazoles, mercapto-tetrazoles, in particular 1-phenyl-5-mercapto-tetrazole, mercapto-pyrimidines, mercaptotriazines, benzothiazoline-2-thione, oxazoline-thione, triazaindenes, tetrazaindenes and pentazaindenes, especially those described by Birr in Z. Wiss. Phot. 47 (1952), pages 2–58, triazolopyrimidines e.g. those described in GB-A 1,203,757, GB-A 1,209,146, JA-Appl. 75-39537, and GB-A 1,500,278, and 7-hydroxy-s-triazolo-[1,5-a]-pyrimidines as described in U.S. patent application Ser. No. 4,727,017, and other compounds e.g. benzenethiosulphonic acid, benzenethiosulphinic acid, and benzenethiosulphonic acid amide. Other compounds that can be used as antifogging agents are metal salts e.g. mercury or cadmium salts and the compounds described in Research Disclosure No. 17643 (1978), Chaptre VI. Other suitable antifogging agents have been described in U.S. Pat. No. 4,948,698 and in the documents referred to therein for that purpose. A preferred antifogging agent is the potassium salt of 2-mercapto-5-chloro-7-sulpho-1,3-benzoxazole.

In addition to the ingredients described above, the imaging element may comprise other various additives such as e.g. alkali-releasing agents, development accelerators, surface-active agents, compounds improving the dimensional stability, UV-absorbers, spacing agents, hardeners, and plasticizers.

These additives may be incorporated into the photosensitive layer and/or into the covering layer.

Suitable surface-active agents include non-ionic agents e.g. saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group e.g. a carboxy, sulpho, phospho, sulphuric or phosphoric ester group; ampholytic agents e.g. aminoacids, aminoalkyl sulphonic acids, aminoalkyl sulphates or phosphates, alkyl betaines, and amine-N-oxides; and cationic agents e.g. alkylamine salts, aliphatic, aromatic, or heterocyclic quaternary ammonium salts, aliphatic or heterocyclic ring-containing phosphonium or sulphonium salts. Such surface-active agents can be used for various purposes e.g. as coating aids, as compounds preventing electric charges, as compounds improving slidability, as compounds facilitating dispersive emulsification, as compounds preventing or reducing adhesion, and as compounds improving the photographic characteristics e.g. higher contrast, sensitization, and development acceleration.

Development acceleration can be accomplished with the aid of various compounds, preferably polyalkylene derivatives having a molecular weight of at least 400 e.g. those described in e.g. U.S. Pat. Nos. 3,038,805, 4,038,075, and 4,292,400.

Suitable additives for improving the dimensional stability of the imaging element are i.a. dispersions of a water-soluble or hardly soluble synthetic polymer e.g. polymers of alkyl (meth) acrylates, alkoxy (meth) acrylates, glycidyl (meth) acrylates, (meth)acrylamides, vinyl esters, acrylonitriles, olefins, and styrenes, or copolymers of the above with acrylic acids, methacrylic acids, α,β-unsaturated dicarboxylic acids, hydroxyalkyl (meth) acrylates, sulphoalkyl (meth) acrylates, and styrene sulphonic acids.

The covering layer should come loose easily and integrally from the lithographic printing plate during separation of the imaging element from said lithographic printing plate and may therefore comprise agents that promote the strippability of the covering layer. Alternatively, the use of a non-proteinic hydrophilic binder, preferably polyvinyl alcohol, as binder in the covering layer may improve the strippability as compared to that of a gelatinous layer. In the case of a gelatinous layer part of the imaging element may indeed remain on the printing plate precursor after stripping and thus lead to an unwanted increase in oleophilicity in the background areas of the printing plate.

The releasing compounds used in the heat-developable silver-based photosensitive imaging element of the present invention can be incorporated into the photosensitive layer or into another layer according to any suitable method. They can be incorporated successfully therein by dissolving them in a low-boiling water-immiscible solvent e.g. ethyl acetate, ethanol, and methanol and/or at least one water-immiscible, high-boiling, hydrocarbon oil-type solvent or oil-former, adding the resulting solution to an aqueous phase, passing the mixture through a homogenizing apparatus so that a dispersion of the oily solution in an aqueous medium is formed, removing the solvent by evaporation, mixing the resulting dispersion to form a layer composition, and coating the resulting composition in the usual manner.

The organic silver salt can be prepared in a suitable binder and be used without being isolated. However, isolated organic silver salt may be dispersed in a binder before being added to the layer composition for forming the photosensitive layer. The dispersion can be made by means of e.g. a ball mill, a sand mill, a colloid mill, a vibration mill, and an ultrasound mill.

The support of the heat-developable silver-based photosensitive imaging element of the present invention can be any material as long as it does not deleteriously affect the photographic properties of the photosensitive layer and is dimensionally stable. Typical flexible sheet materials are paper supports e.g. coated on one or on both sides with an α-olefin polymer e.g. polyethylene. Other suitable supports can be chosen from synthetic resin film supports e.g. cellulose nitrate film, cellulose acetate film, polyvinyl acetal film, polyvinyl chloride film, polystyrene film, polyethylene terephthalate film, polycarbonate film, a poly-α-olefin film such as a polyethylene or polypropylene film, and related films or resinous materials.

The heat-induced development and the release of said hydrophobizing agent from said releasing compound is performed by heating said imaging element while in contact or before being brought in contact with said oleophobic surface, the heat being supplied according to any suitable heating method e.g. by the use of a heating plate or body, heating rollers, or a hot drum. Alternatively, the material may be passed through a hot atmosphere or high frequency heating can be applied. Continuous or discontinuous heating can be used. For instance, a first heating step can be performed by heating said imaging element while in contact or before being brought in contact with said oleophobic surface to cause development and a second heating step can be performed by heating the developed imaging element to allow said hydrophobizing agent to diffuse more easily or more rapidly to said oleophobic surface and render it image-wise oleophilic.

The heat-induced development and the release of said hydrophobizing agent from said releasing compound can be accomplished by heating said imaging element while in contact or before being brought in contact with said oleophobic surface to a temperature in the range of 80° to 200° C., preferably 110° to 175° C., for a period of from 1 to 180 s, preferably 3 to 60 s.

The printing plate precursor for use in the method of the present invention can comprise or consist of any plate, sheet or foil commonly used in the lithographic printing art, provided at least one integral surface of said printing plate precursor has been rendered oleophobic or is an oleophobic surface and said surface is capable of reacting with the image-wise diffusing hydrophobizing agent.

Examples of plates, sheets or foils that can be oleophobized or are oleophobic are paper sheets, polyester film sheets, which may have been coated with a hydrophilic layer as disclosed in e.g. U.S. Pat. No. 3,971,660, a paper sheet or polyethylene sheet, which may have been coated with a hydrophilic layer, a metallized polyester film sheet, and metallic foils of e.g. zinc or aluminium. Any metallic or metallized sheet or foil that is hydrophilic and is capable of reacting with the image-wise diffusing hydrophobizing agent is preferably used as printing plate precursor in the method of the present invention.

Thus, although a metallic foil of e.g. aluminium is hydrophilic in se, it may have to be provided with a supplemental continuous oleophobic layer to render it capable of reacting satisfactorily with said released hydrophobizing agent. Examples of such oleophobic agents or layers are bismuth or silver and layers thereof. A preferred continuous oleophobic metal layer is a layer of metallic silver. A continuous metal layer can be applied by vapour deposition or by vacuum deposition e.g. on an aluminium foil.

Another method for applying a continuous metal layer to a plate, sheet or foil comprises depositing metal salt complexes according to the silver salt diffusion transfer process on said plate, sheet or foil in the presence of developing agents and preferably in the presence of physical development nuclei. The principles of the silver salt diffusion transfer process have been described in e.g. U.S. Pat. No. 2,352,014 and more detailedly in "Photographic Silver Halide Diffusion Processes" by André Rott and Edith Weyde—The Focal Press—London and New York, (1972).

The silver salt diffusion transfer process is particularly suitable for applying a continuous metallic silver layer to a plate, sheet or foil e.g. an aluminium foil. A preferred printing plate precursor is an aluminium foil provided with an oleophobic continuous metallic silver layer.

When the oleophobic surface of said printing plate precursor is an oleophobic metal layer, it may be advantageous—after formation of the oleophilic image on said oleophobic metal surface—to improve the legibility of the printing plate obtained. The thus obtained printing plate can therefore be treated with a bleaching liquid to remove the metal layer, preferably a silver metal layer, in the areas of the lithographic printing plate where no or insufficient reaction of the metal layer with the released hydrophobizing agent has occurred. The bleaching liquid comprises a bleaching agent, in the case of a silver metal layer a silver-bleaching agent, e.g. iron(III) salts and complexes, iodine, hydrogen peroxide, and quinone. An iron(III) complex is preferably used. The treatment with a bleaching liquid may also improve the differentiation between the oleophilic and the oleophobic parts of the printing plate obtained, in other words between the image parts and the non-image pans.

A subsequent treatment of the printing plate with a solution containing hydrophobizing agents may still further improve the differentiation between the oleophilic and oleophobic parts. U.S. Pat. No. 3,776,728 describes the use of heterocyclic mercapto compounds e.g. a 2-mercapto-1,3,4-oxadiazole derivative as hydrophobizing agent. U.S. Pat. No. 4,563,410 discloses hydrophobizing liquids containing one or more mercaptotriazole or mercaptotetrazole derivatives.

The legibility of the printing plate can also be improved as a result of the use of at least one chromophoric group in the coupler compound, said chromophoric group being releasable together with the hydrophobizing agent during the development and being capable of diffusing to said oleophobic surface to render said surface image-wise oleophilic and at the same time more legible.

Suitable aluminium foils for use in the method of the present invention are made of pure aluminium or of an aluminium alloy, the aluminium content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the foil usually ranges from about 0.13 to about 0.50 mm.

The preparation of aluminium or aluminium alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improves the printing results.

Graining of the aluminium surface can be carried out mechanically or electrolytically in any known way. The roughness produced by the graining is measured as a centre line average value expressed in μm and preferably varies from about 0.2 to about 1.5 μm.

The anodization of the aluminium foil can be performed in electrolytes e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.0 μtm.

After the anodizing step the anodic surface may be sealed. Sealing of the pores of the aluminium oxide layer formed by anodization is a technique known to those skilled in the art of aluminium anodization. This technique has been described in e.g. the "Belgisch-Nederlands tijdschrift voor Oppervlaktetechnieken van materialen", 24ste jaargang/ januari 1980, under the title "Sealing-kwaliteit en sealing-controle van geanodiseerd Aluminium". Different types of sealing of the porous anodized aluminium surface exist. An advantageous sealing method is the hydration-sealing method, according to which the pores are closed or partially closed through water-acceptance so that hydrated needle-like aluminium oxide crystals (böhmite) are formed. The anodic surface of the aluminium foil can thus be rinsed with water at 70°–100° C. or with steam. The hot sealing water may comprise additives e.g. nickel salts to improve the sealing effect. The sealing can also be performed by treatment of the anodic surface with an aqueous solution comprising phosphate ions or silicates. Thanks to the sealing treatment the anodic layer is rendered substantially non-porous so that longer press runs can be made with the printing plate obtained. As a result of the sealing the occurrence of fog in the non-printing areas of the printing plate is avoided substantially.

The graining, anodizing, and sealing of the aluminium foil can be performed as described in e.g. U.S. patent application Ser. No. 3,861,917 and in the documents referred to therein.

According to an alternative embodiment of the imaging element of the present invention a strippable assemblage is provided, which comprises in the given order:

- a printing plate precursor having an oleophobic surface as above described e.g. an aluminium foil carrying a continuous metallic silver layer,
- a stripping layer,
- a photosensitive imaging element comprising a heat-reducible organic silver salt, a photosensitive silver halide, a developing agent, preferably an aromatic primary amino developing agent, and a releasing compound that upon reaction with either the reduced or the oxidized form of said developing agent is capable of releasing a hydrophobizing agent,
- at least one adhesion-improving layer, and
- a transparent synthetic resin film e.g. a polyethylene film, a cellulose acetate film, a polyethylene terephthalate film, or a polyvinyl chloride film.

The stripping layer is a layer, which upon completion of said thermal development and transfer, allows separation of said printing plate carrying an oleophilic image from the other layers including said stripping layer.

The strippable assemblage can be made by consecutively applying the following layers to a printing plate precursor having an oleophobic surface as above described e.g. an aluminium foil carrying a continuous metallic silver layer: a said stripping layer, a photosensitive imaging element comprising a heat-reducible organic silver salt, a photosensitive silver halide, a developing agent, preferably an aromatic primary amino developing agent, and a releasing compound that upon reaction with either the reduced or the oxidized form of said developing agent is capable of releasing a hydrophobizing agent, at least one adhesion-improving layer, and a transparent synthetic resin film of e.g. polyethylene, cellulose acetate, poyethylene terephthalate, and polyvinyl chloride.

Alternatively, the strippable assemblage can be made by making a layer packet comprising a transparent synthetic resin film coated consecutively with at least one adhesion-improving layer, a photosensitive imaging element comprising a heat-reducible organic silver salt, a photosensitive silver halide, a developing agent, preferably an aromatic primary amino developing agent, and a releasing compound that upon reaction with either the reduced or the oxidized form of said developing agent is capable of releasing a hydrophobizing agent, and optionally a stripping layer, and at any desired moment laminating said layer packet with the side showing the photosensitive imaging element onto a printing plate precursor having an oleophobic surface as above described e.g. an aluminium foil carrying a continuous metallic silver layer.

The image-wise exposure of the strippable assemblage is performed through the transparent synthetic resin film and thermal development is carried out as above described.

The present invention is illustrated by the following example without limiting it thereto.

EXAMPLE 1

A heat-developable silver-based photosensitive imaging element was made by coating a photosensitive layer on a subbed polyethylene terephthalate film support having a thickness of 100 μm, said photosensitive layer comprising:

- a photosensitive sulphur-ripened silver bromide chloride emulsion (silver chloride content <2% by weight) having a homodisperse grain size distribution and average grain size of 0.41 μm, the silver halide being present in an amount corresponding to 1.00 g/m2 of silver nitrate; the silver halide had been sensitized spectrally by adding thereto 637 g of sensitizer solution to make a total weight of 7946 g, the sensitizer solution consisting of 1 g of sensitizing agent S1, 1 g of sensitizing agent S2, 500 ml of methanol, 50 ml of citrate buffer, and demineralized water to make a volume of 1000 ml, the above-mentioned citrate buffer consisting of 16.2 g of citric acid, 7.0 g of sodium hydroxide, and demineralized water to make a volume of 1000 ml,

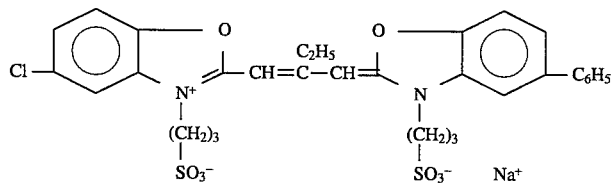

-continued

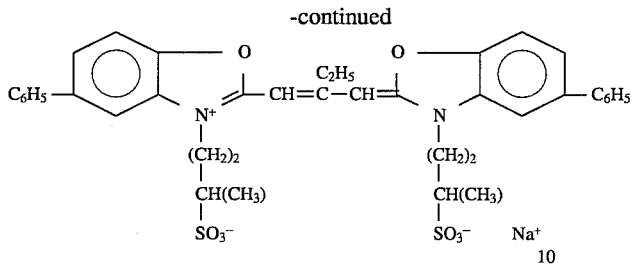
S2 an organic silver salt present in an amount corresponding to 1.00 g/m2 of silver nitrate, the organic silver salt being taken from a ground dispersion comprising 88.8 g of 1-silver-5-methyl-benzotriazolate (expressed as silver nitrate), 71.9 g of polyvinyl pyrrolidone, and 31.1 g of gelatin per kg of ground dispersion, 0.93 g/m2 of the coupler compound CC4 taken from an aqueous dispersion comprising 100 g of CC4, 50 g of gelatin, and 2.5 g of the sodium salt of n-dodecyl-benzene sulphonic acid per kg of dispersion, 4.0 g/m2 of 2-ethyl-2-(hydroxymethyl)-1,3-propanediol, and 0.0022 g/m2 of 2-mercapto-5-chloro-7-sulpho-1,3-benzoxazole, said photosensitive layer having a total gelatin content of 1.8 g/m2 and said photosensitive layer being coated with a covering layer comprising 2.5 g/m2 of developing agent D1 and 1.5 g/m2 of polyvinyl alcohol.

A printing plate precursor having an oleophobic surface was made by transferring an integral silver layer according to the silver salt diffusion transfer reversal method (DTR-method) from an unexposed commercially available camera-sensitive negative CRRA AGFA COPYRAPID material on an aluminium foil having a thickness of 0.15 mm and which had been grained electrochemically, anodized, sealed, and coated with a silver-receptive stratum from a silver sol in water comprising no binder, the resulting stratum having a weight in dried condition of 4 mg of silver per m2. The transferred integral silver layer comprised 0.44 g/m2 of silver.

The photosensitive imaging element was cut into several identical strips. All strips were exposed identically for 1 s through a transparent black-and-white original to a set of 4 incandescent lamps of 150 W placed at a distance of 50 cm.

The heat development was carried out in the following way. The printing plate precursor was fixed on an electrically heated metal drum, the temperature and the heating time of which were adjustable. A strip of the exposed photosensitive imaging element was pressed against the printing plate precursor by means of clamps. After heat development, which was repeated for each strip, at a temperature and for a time as indicated in Table I hereinafter, the imaging element was separated from the resulting printing plate.

The ink reception of each printing plate obtained was checked by making a test run of 100 prints on an offset press running with a commonly employed ink and fountain solution.

The reflection density (D) with standard deviation (S) of the 100th print obtained from each strip was measured by means of a McBeth RD918-SB densitometer at 10 different places of each exposed and each unexposed part so that the differentiation in ink reception could be deduced.

TABLE I

| | | Ink reception | | | |
| | | exposed | | unexposed | |
| Strip | Heat Development | D | S | D | S |
| --- | --- | --- | --- | --- | --- |
| A | 125° C. 90 s | 0.75 | 0.10 | 0.28 | 0.05 |
| B | 125° C. 90 s | 0.74 | 0.06 | 0.31 | 0.08 |
| C | 110° C. 300 s | 0.94 | 0.03 | 0.75 | 0.08 |

We claim:

1. Method for producing a lithographic printing plate in a dry manner comprising the steps of:

image-wise exposing a heat-developable silver-based photosensitive imaging element comprising a heat-reducible organic silver salt, a photosensitive silver halide capable of forming a latent image that acts as a catalyst to induce development of said organic silver salt under influence of heat, a releasing compound that upon a redox-controlled reaction with either the reduced or the oxidized form of a developing agent is capable of releasing a hydrophobizing agent, and said developing agent, bringing said image-wise exposed imaging element in face-to-face contact with a oleophobic surface of a printing plate precursor, heating said imaging element while in contact or before being brought in contact with said oleophobic surface to cause reduction of said organic silver salt at places where such reduction has been induced by the latent image and to cause thereby the image-wise release of said hydrophobizing agent from said releasing compound, allowing said hydrophobizing agent to diffuse to said oleophobic surface to render said surface image-wise oleophilic, and separating the resulting lithographic printing plate from said heat-developable silver-based photosensitive imaging element.

2. A method according to claim 1, wherein said printing plate precursor is a metallic or metallized sheet or foil that is hydrophilic and is capable of reacting with an image-wise diffusing hydrophobizing agent.

3. A method according to claim 1 or 2, wherein said printing plate precursor is an aluminium foil provided with an oleophobic continuous metallic silver layer.

4. The method according to claims 1, wherein said hydrophobizing agent is allowed to diffuse while supplying additional heat to said imaging element to render said oleophobic surface image-wise oleophilic.

* * * * *